(12) United States Patent
Iwaki (10) Patent No.: US 10,983,162 B2
(45) Date of Patent: Apr. 20, 2021

(54) SEMICONDUCTOR DEVICE INSPECTION METHOD AND SEMICONDUCTOR DEVICE INSPECTION DEVICE

(71) Applicant: HAMAMATSU PHOTONICS K.K., Hamamatsu (JP)

(72) Inventor: Yoshitaka Iwaki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 102 days.

(21) Appl. No.: 16/343,809

(22) PCT Filed: Aug. 1, 2017

(86) PCT No.: PCT/JP2017/027857
§ 371 (c)(1),
(2) Date: Apr. 22, 2019

(87) PCT Pub. No.: WO2018/078993
PCT Pub. Date: May 3, 2018

(65) Prior Publication Data
US 2019/0265297 A1 Aug. 29, 2019

(30) Foreign Application Priority Data
Oct. 26, 2016 (JP) .............................. JP2016-209774

(51) Int. Cl.
*G01R 31/317* (2006.01)
*G01R 31/265* (2006.01)
(Continued)

(52) U.S. Cl.
CPC ....... *G01R 31/31728* (2013.01); *G01R 31/26* (2013.01); *G01R 31/2656* (2013.01); *G01R 31/302* (2013.01)

(58) Field of Classification Search
CPC ............ G01R 31/31728; G01R 31/302; G01R 31/26; G01R 31/2656; G01R 31/31725; G01R 31/2882; G01R 31/308
(Continued)

(56) References Cited

U.S. PATENT DOCUMENTS 4,072,200 A * 2/1978 Morris ................ E21B 47/0228
175/45
8,264,235 B2 * 9/2012 De Vries ................ H01L 22/34
324/525
(Continued)

FOREIGN PATENT DOCUMENTS

JP 2007-64975 A 3/2007
JP 2010-190738 A 9/2010
(Continued)

OTHER PUBLICATIONS

International Preliminary Report on Patentability dated May 9, 2019 for PCT/JP2017/027857.

*Primary Examiner* — Giovanni Astacio-Oquendo
(74) *Attorney, Agent, or Firm* — Faegre Drinker Biddle & Reath LLP (57) ABSTRACT

An inspection method for inspecting a semiconductor device which is an object to be inspected includes a step of inputting an input signal to the semiconductor device, a step of irradiating the semiconductor device with light, a step of outputting a result signal indicating a change in a state of the semiconductor device based on an output signal which is output from the semiconductor device to which the input signal is input while the semiconductor device is irradiated with the light, and a step of deriving time information relating to a time from the input of the input signal to the semiconductor device to the output of the result signal.

15 Claims, 8 Drawing Sheets

(51) Int. Cl.
*G01R 31/302* (2006.01)
*G01R 31/26* (2020.01)

(58) Field of Classification Search
USPC ............... 324/71.11, 73.1, 76.11, 754.23
See application file for complete search history.

(56) References Cited

U.S. PATENT DOCUMENTS

| | | |
|---|---|---|
| 2005/0006602 A1 | 1/2005 | Perdu et al. |
| 2008/0218750 A1 | 9/2008 | Desplats |
| 2008/0232181 A1* | 9/2008 | Higashi ............... G11C 7/1069 |
| | | 365/201 |
| 2013/0314116 A1 | 11/2013 | Vedagarbha et al. |
| 2014/0285227 A1 | 9/2014 | Serrels et al. |
| 2016/0291088 A1* | 10/2016 | Pfaff ................... G01R 31/2653 |
| 2017/0059645 A1* | 3/2017 | Pan .................. G11C 29/50008 |
| 2020/0110129 A1* | 4/2020 | Nakamura ............ G01R 31/302 |

FOREIGN PATENT DOCUMENTS

| | | |
|---|---|---|
| JP | 2010-197051 A | 9/2010 |
| JP | 2011-191209 A | 9/2011 |
| JP | 2012-58247 A | 3/2012 |

\* cited by examiner

| High | High | ... | Low | High |
|------|------|-----|-----|------|
| High |      |     |     | ⋮    |
| ⋮    |      | Low |     | ⋮    |
| High |      |     |     | ⋮    |
| Low  | ...  | ... | ... | Low  |

Fig.8

| tP/F_A (1,1) | tP/F_A (2,1) | ... | No Signal (n-n,1) | tP/F_C (n,1) |
|---|---|---|---|---|
| No Signal (1,2) | | | | ⋮ |
| ⋮ | | tP/F_B (i,j) | | ⋮ |
| tP/F_B (1,m-1) | | | | ⋮ |
| tP/F_C (1,m) | ... | ... | ... | tP/F_A (n,m) |

SEMICONDUCTOR DEVICE INSPECTION METHOD AND SEMICONDUCTOR DEVICE INSPECTION DEVICE

TECHNICAL FIELD

The present disclosure relates to semiconductor device inspection method and a semiconductor device inspection apparatus.

BACKGROUND ART

Patent Literature 1 discloses a device that inspects a semiconductor device using irradiation with a laser beam. In this device, a semiconductor device is irradiated with a laser beam of less than 1064 nm having energy larger than the bandgap of silicon. Pass/Fail information of a semiconductor device changing due to a photo-electromotive current caused by this irradiation is measured. The Pass/Fail information indicates a change in the operating state of a semiconductor device which is caused by irradiation with a laser beam. Therefore, it is possible to specify defective points of a semiconductor device on the basis of the Pass/Fail information.

CITATION LIST

Patent Literature

[Patent Literature 1] Japanese Unexamined Patent Publication No. 2012-58247

SUMMARY OF INVENTION

Technical Problem

The above-described device of the related art does nothing but specify defective points of a semiconductor device depending only on the presence or absence of a change in the state of Pass/Fail due to irradiation with a laser beam, and thus it cannot perform various analyses on a semiconductor device.

An object of the present disclosure is to provide a semiconductor device inspection method and a semiconductor device inspection apparatus which make it possible to perform various analyses on a semiconductor device.

Solution to Problem

According to an aspect, there is provided a semiconductor device inspection method for inspecting a semiconductor device which is an object to be inspected, the method including: a step of inputting an input signal to the semiconductor device; a step of irradiating the semiconductor device with light; a step of outputting a result signal indicating a change in a state of the semiconductor device on the basis of an output signal which is output from the semiconductor device to which the input signal is input while the semiconductor device is irradiated with the light; and a step of deriving time information relating to a time from the input of the input signal to the semiconductor device to the output of the result signal.

In such a semiconductor device inspection method, the irradiation of a semiconductor device with light may cause the occurrence of a change in the state of the semiconductor device. In a case where a change in the state of the semiconductor device occurs, a change may also occur in an output signal, and thus a change in the state of the semiconductor device can be output as a result signal. It is possible to measure a timing at which a state change occurs by acquiring time information relating to a time from the input of the input signal to the output of the result signal. In this manner, it is possible to perform various analyses on a semiconductor device by deriving not only the result signal indicating a state change, but also the time information relating to a state change.

In an aspect, the step of inputting the input signal may include generating a loop trigger signal according to the input signal, and the step of deriving the time information may include using the loop trigger signal as a reference for the input of the input signal. It is possible to more reliably specify the input of the input signal by using a loop trigger signal as a reference.

In an aspect, a position of irradiation with the light may be moved in accordance with the loop trigger signal. According to such a configuration, the movement of the position of irradiation with the light on a semiconductor device and the input of the input signal can be reliably synchronized with each other.

In an aspect, a step of generating a measurement image having the position of irradiation with the light and the time information associated with each other may be further included. In this case, it is possible to easily ascertain the time information at the irradiation position with reference to the measurement image.

In an aspect, a step of detecting reflected light of the light reflected from the semiconductor device and a step of generating a pattern image of the semiconductor device on the basis of the detected reflected light and the position of irradiation with the light may be further included. In this case, a step of superimposing the pattern image and the measurement image on each other may be further included. In this case, it is possible to easily ascertain a relationship between the time information at the irradiation position and a position on the semiconductor device with reference to the measurement image superimposed on the pattern image.

In an aspect, the input signal may include a test pattern signal. In this case, the input signal may include a plurality of test patterns. According to such a configuration, in a single measurement, it is possible to input a plurality of test patterns in which a change in the state of a semiconductor device may occur.

According to an aspect of the present disclosure, there is provided a semiconductor device inspection apparatus that inspects a semiconductor device which is an object to be inspected on the basis of a result signal which is output in accordance with input of an input signal to the semiconductor device, the device including: a light source that generates light; a scanning unit that scans the semiconductor device with the light; and a time measurement unit to which the result signal indicating a change in a state of the semiconductor device irradiated with the light is input, and which derives and outputs time information relating to a time from the input of the input signal to the semiconductor device to the output of the result signal.

In such a semiconductor device inspection apparatus, a state change occurring due to the irradiation of a semiconductor device with light can be output as a result signal. It is possible to measure a timing at which a state change occurs by acquiring time information relating to a time from the input of the input signal to the output of the result signal. In this manner, it is possible to perform various analyses on a semiconductor device by deriving not only the result signal indicating a state change, but also the time information relating to a state change.

In an aspect, the time measurement unit may include a time-to-digital converter or a time-to-amplitude converter. According to such a configuration, it is possible to easily realize the time measurement unit.

In an aspect, the time measurement unit may have a loop trigger signal according to the input signal input thereto, and use the loop trigger signal as a reference for the input of the input signal. It is possible to more reliably specify the start of input of the input signal by using the loop trigger signal as a reference.

In an aspect, the scanning unit may perform scanning with the light in accordance with the loop trigger signal according to the input signal. According to such a configuration, the movement of a position of scanning with light on a semiconductor device and the input of the input signal can be reliably synchronized with each other.

In an aspect, an analysis unit to which the time information is input, and which generates a measurement image having a position of scanning with the light and the time information associated with each other may be further included. In this case, it is possible to easily ascertain the time information at the irradiation position with reference to the measurement image.

In an aspect, a photodetector that detects reflected light of the light reflected from the semiconductor device, and outputs a detection signal may be further included, and the analysis unit may generate a pattern image of the semiconductor device on the basis of the detection signal and the position of scanning with the light. In this case, the analysis unit may superimpose the pattern image and the measurement image on each other. In this case, it is possible to easily ascertain a relationship between the time information at the irradiation position and a position on the semiconductor device with reference to the measurement image superimposed on the pattern image.

Effects of Invention

According to a semiconductor device inspection method and a semiconductor device inspection apparatus of an aspect, it is possible to perform various analyses on a semiconductor device.

DESCRIPTION OF EMBODIMENTS

Hereinafter, embodiments will be described in detail with reference to the accompanying drawings. For convenience, components which are substantially the same are denoted by the same reference numerals and signs, and may not be described.

First Embodiment

Figure 1:
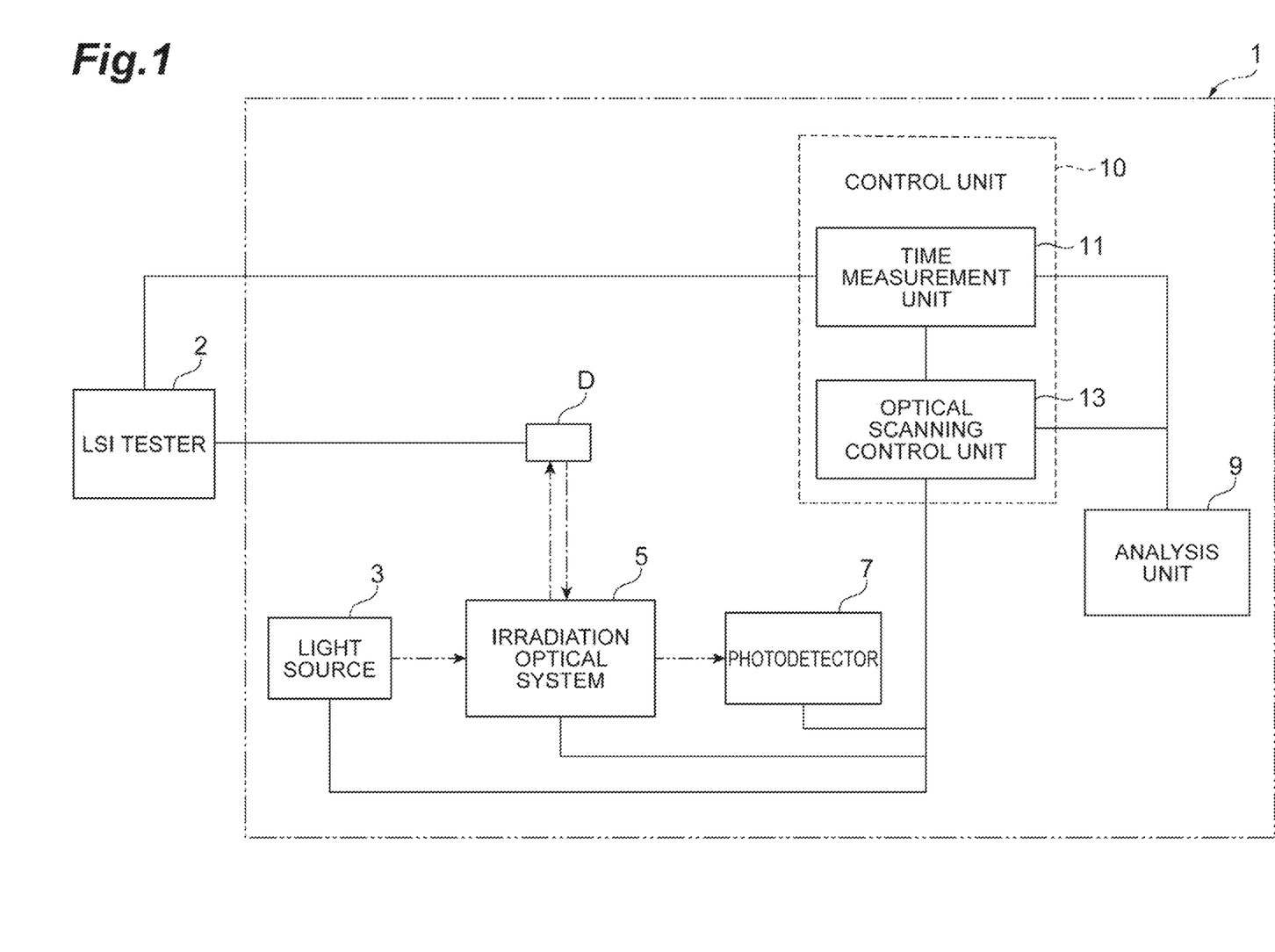
FIG. 1 is a configuration diagram of a semiconductor device inspection apparatus according to an embodiment.

As shown in FIG. 1, a semiconductor device inspection apparatus 1 according to the present embodiment is an apparatus that acquires a result signal which is output in accordance with the input of a test pattern signal to a semiconductor device D which is an object to be inspected. The semiconductor device inspection apparatus 1 is used in, for example, soft defect localization (SDL) measurement, laser assisted device alteration (LADA) measurement, or the like. Examples of the semiconductor device D include an integrated circuit (for example, small scale integration (SSI), medium scale integration (MSI), large scale integration (LSI), very large scale integration (VLSI), ultra large scale integration (ULSI), or giga scale integration (GSI)) having a PN junction of a transistor or the like, a MOS transistor and a bipolar transistor for large current/high voltage, a semiconductor element for power (a power device), and the like. In addition, the semiconductor device D may be a package including a semiconductor device, a composite substrate, or the like.

An LSI tester 2 is electrically connected to the semiconductor device D. The LSI tester 2 inputs a test pattern signal (test pattern) as an input signal to the semiconductor device D (see FIG. 3). The test pattern signal is a signal for analysis in which a signal of a certain pattern loops in a fixed period. The test pattern signal is set by, for example, a user. In addition, the LSI tester 2 generates a result signal indicating Pass/Fail information on the basis of a test signal (output signal) which is output from the semiconductor device D to which a test pattern signal is input. For example, the LSI tester 2 compares a test signal which is output from the semiconductor device D with a correct test signal according to a design with respect to a test pattern signal. The LSI tester 2 outputs a change in Pass/Fail information based on the comparison result as a result signal.

Further, the LSI tester 2 outputs a generated result signal or various signals according to a test pattern signal. In the present embodiment, the LSI tester 2 outputs for example, a loop trigger signal (loop trigger) synchronized with a test pattern signal (see FIG. 3). The trigger timing of the loop trigger signal is coincident with a timing (reset timing) at which an input in each loop of a test pattern signal is started. In addition, the LSI tester 2 also serves as a power supply device. The LSI tester 2 inputs a current which is set in advance to the semiconductor device D. A current which is input to the semiconductor device D is set in advance to a drive voltage or a drive frequency which has a tendency to cause Pass/Fail information in a result signal to be changed. In addition, the power supply device (not shown) may be provided separately from the LSI tester 2, and may be configured to input a current which is set in advance to the semiconductor device D. Meanwhile, in a case where the semiconductor device D has a function of an LSI tester included therein, it is not necessary to prepare an external LSI tester.

The semiconductor device inspection apparatus 1 of the present embodiment includes a light source 3, an irradiation optical system 5, a photodetector 7, a control unit 10, and an analysis unit 9. The light source 3 generates and outputs continuous wave (CW) light or pulsed light with which the semiconductor device D is irradiated. The light which is output from the light source 3 may be incoherent light, or may be coherent light such as a laser beam. As the light source 3 that outputs incoherent light, a super luminescent diode (SLD), an amplified spontaneous emission (ASE), a light emitting diode (LED), or the like can be used. In addition, as the light source 3 that outputs coherent light, a solid-state laser light source, a semiconductor laser light source, or the like can be used. In addition, the LSI tester 2 and the light source 3 may be electrically connected (not shown) to each other, and light which is generated by the light source 3 may be changed in accordance with a signal which is output from the LSI tester 2. For example, control may be performed so that it is synchronized with a signal which is output from the LSI tester 2, and that pulsed light is output from the light source 3.

In the case of SDL measurement, in order to obtain an effect of heating in the semiconductor device D, light which is generated from the light source 3 is preferably light having a wavelength with photon energy smaller than that of the bandgap of silicon. As an example, the wavelength of light which is generated from the light source 3 may be approximately 1300 µm. In addition, in the case of LADA measurement, in order to generate a photo-electromotive current in the semiconductor device D, light which is generated from the light source 3 has a wavelength with photon energy greater than that of the bandgap of silicon. As an example, the wavelength of light which is generated from the light source 3 may be approximately 1064 nm. Meanwhile, the above wavelength is an example in a case where a substrate of silicon is used as the semiconductor device D. In a case where the semiconductor device D is constituted by a substrate of silicon carbide (SiC), sapphire, a compound semiconductor, and the like, wavelengths appropriate for these materials are appropriately selected. The light which is output from the light source 3 is input to the irradiation optical system 5.

The irradiation optical system 5 irradiates the semiconductor device D with the light which is output from the light source 3. More specifically, the irradiation optical system 5 can irradiate a predetermined position of the semiconductor device D with light, or scan a predetermined region of the semiconductor device D with light. In the irradiation optical system 5, an optical scanning element (scanning unit), a light-splitting optical system, an objective lens, and the like are configured to be optically coupled to each other. For example, the optical scanning element may be constituted by a galvanometer mirror, a micro electro mechanical system (MEMS) mirror, a polygon mirror, or the like. The light-splitting optical system may be constituted by a polarization beam splitter and a ¼-wavelength plate, and may be constituted by a half mirror. The objective lens may be constituted by, for example, an objective lens of multiple magnifications, and a plurality of objective lenses may be configured to be switchable by a revolver.

The photodetector 7 detects reflected light from the semiconductor device D in accordance with the irradiation light, and outputs a detection signal. The photodetector 7 is, for example, a photodiode, an avalanche photodiode, a photomultiplier tube, an area image sensor, or the like. The photodetector 7 has at least one detector. The photodetector 7 detects the intensity of light detected by the detector.

The control unit 10 performs processing of various signals which are output from the LSI tester 2, and control of the light source 3, the irradiation optical system 5, the photodetector 7, and the LSI tester 2. In addition, the control unit 10 outputs various signals, information which is used in the operation of the irradiation optical system, or the like to the analysis unit 9. In the present embodiment, the control unit 10 includes a time measurement unit 11 and an optical scanning control unit 13. The time measurement unit 11 derives time information relating to a time from the start of input of a test pattern signal to the semiconductor device D to the output of a result signal. For example, the time measurement unit 11 resets time measurement by receiving a loop trigger signal which is output from the LSI tester 2, and outputs a time ($t_{P/F}$) from the reset time to a time at which a result signal is output as time information. The time measurement unit 11 may be configured to include, for example, a time-to-digital converter (TDC) or a time-to-amplitude converter (TAC).

The optical scanning control unit 13 is electrically connected to the light source 3, the irradiation optical system 5 and the photodetector 7. The optical scanning control unit 13 controls a light irradiation position (scanning position), a movement speed (scanning speed) or the like with respect to the semiconductor device D. For example, the optical scanning control unit 13 controls the irradiation optical system 5 on the basis of a pixel clock which is a timing signal equivalent to one pixel unit and position information relating to a light irradiation position. Thereby, for example, the irradiation optical system 5 moves a scanning range pixel by pixel in accordance with the position information in synchronization with the pixel clock. In the present embodiment, the pixel clock is synchronized with a loop trigger signal which is synchronized with a test pattern signal. Thereby, the optical scanning control unit 13 moves the light scanning position in accordance with the loop trigger signal. Therefore, at any position in the semiconductor device D, the timing of light irradiation performed by the irradiation optical system 5 and the timing of input of a test pattern signal performed by the LSI tester 2 can be caused to be coincident with each other. In addition, a detection signal of reflected light from the photodetector 7 is input to the optical scanning control unit 13. The optical scanning control unit 13 outputs position information of light irradiation performed by the irradiation optical system 5 and a detection signal of reflected light at the position to the analysis unit 9.

The analysis unit 9 generates a measurement image having a light scanning position and time information associated with each other, on the basis of the position information of light irradiation which is input from the optical scanning control unit 13 and the time information which is input from the time measurement unit 11. That is, the analysis unit 9 generates a measurement image obtained by mapping the time information in response to the light irradiation position. The measurement image may be represented by, for example, a gradation or a color tone according to the value of a time indicated by the time information. The analysis unit 9 is constituted by, for example, a computer including a CPU and a RAM and a ROM which are recording mediums, and is provided with a display unit such as a display and an input unit such as a mouse or a keyboard. In addition, the analysis unit 9 generates a pattern image which is an optical image of the semiconductor device D from the information of a light scanning position and the detection signal from the photodetector 7. A circuit pattern of the semiconductor device D is shown in the pattern image. Further, the analysis unit 9 can superimpose the measurement image on the pattern image to display the result. Thereby, a position considered to be a fault point can be checked on the circuit pattern.

Hereinafter, a semiconductor device inspection method in the present embodiment will be described with reference to FIGS. 2 to 4. In the present embodiment, before inspection, conditions of a test pattern signal which is input to the semiconductor device D, a region in which measurement is executed in the semiconductor device D, and the like are set by a user. In addition, a current having a drive voltage and a drive frequency in the vicinity of a boundary having a change in a Pass/Fail state of the semiconductor device D is applied to the semiconductor device D by the LSI tester 2. Thereby, the semiconductor device D is driven. For example, in the case of SDL measurement in which the semiconductor device D is heated by a laser beam, conditions of a drive voltage and a drive frequency in the vicinity of a boundary having a change in a Pass/Fail state are obtained in advance using a shmoo plot when the semiconductor device D is heated all around by a heater or the like.

Figure 2:
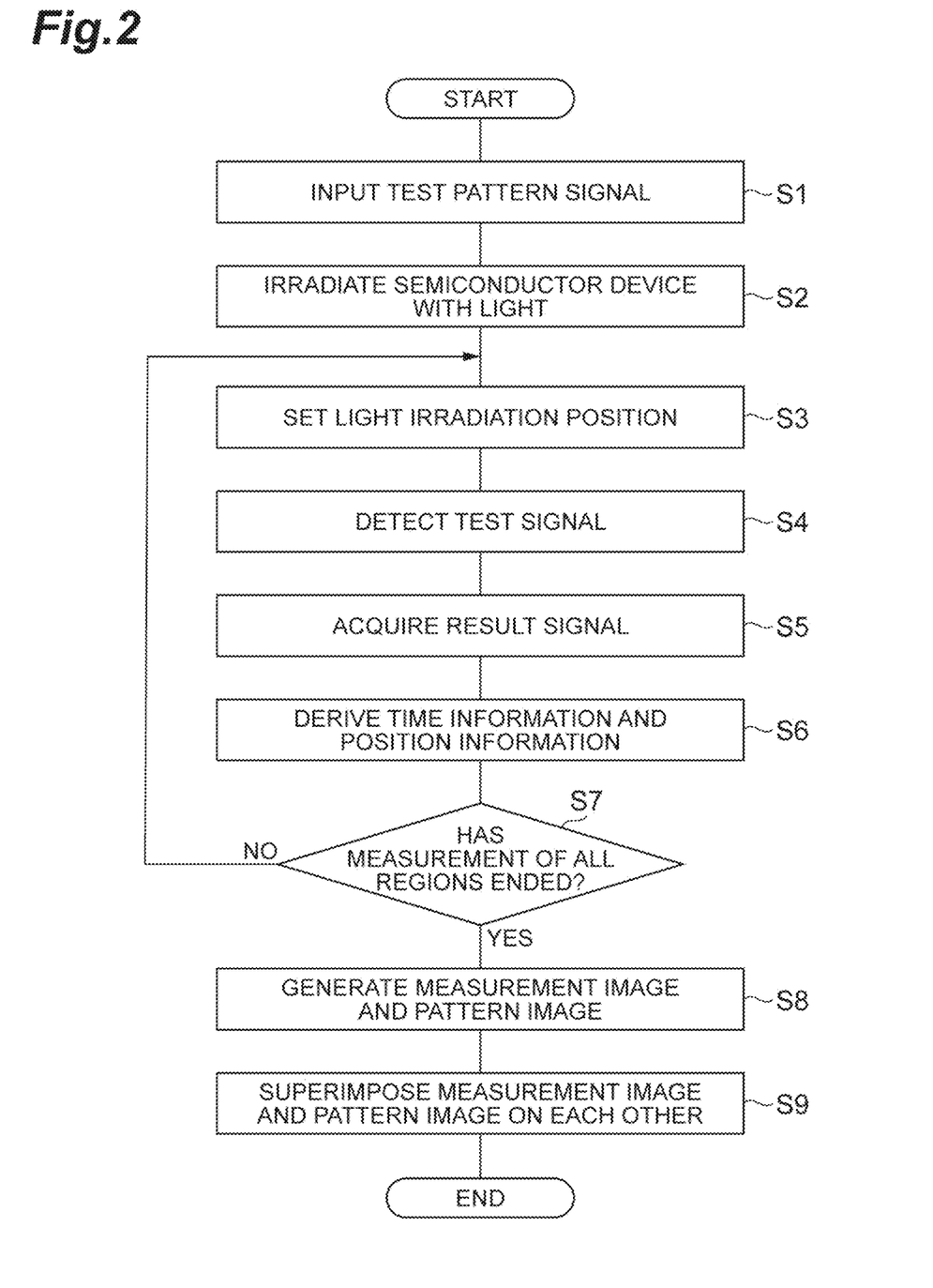
FIG. 2 is a flow diagram illustrating a semiconductor device inspection method which is executed by the semiconductor device inspection apparatus.

In the inspection method in the present embodiment, as shown in FIG. 2, a test pattern signal is first input from the LSI tester 2 to the semiconductor device D (Step S1), and the semiconductor device D is irradiated with light (Step S2). In this case, the irradiation position of light with which the semiconductor device D is irradiated is controlled by the irradiation optical system 5 (Step S3). In a case where a test pattern signal is output from the LSI tester 2 in Step S1, the LSI tester 2 also outputs a loop trigger signal synchronized with the test pattern signal.

In a state where the semiconductor device D is irradiated with light, a test signal which is output from the semiconductor device D to which a test pattern signal is input is input to the LSI tester 2 (Step S4). In Step S4, the photodetector 7 detects reflected light reflected from the semiconductor device. A signal of the detected reflected light is input to the analysis unit 9 through the optical scanning control unit 13. In a case where the test signal is detected by the LSI tester 2, the LSI tester 2 outputs a result signal indicating a change in the state of Pass/Fail of the semiconductor device D caused by light irradiation to the control unit 10 on the basis of the test signal (Step S5).

In the control unit 10, time information relating to a time ($t_{P/F}$) from input of a test pattern signal to the semiconductor device D to output of a result signal is derived in the time measurement unit 11 (Step S6). In Step S6, for example, a loop trigger signal can be used as a reference for input of a test pattern signal. As described above, the loop trigger signal is synchronized with a test pattern signal, but the timing of the loop trigger signal is changed by shifting a synchronization timing, whereby a reference for input of the test pattern signal may be shifted. In the analysis unit 9, image data corresponding to a laser beam irradiation position is generated on the basis of the time information.

Subsequently, the control unit 10 judges whether measurement for the entire range of a designated measurement region has ended (Step S7). In a case where the measurement for the designated region has not ended, the next irradiation position is scanned with light by the irradiation optical system 5 in synchronization with a pixel clock. Processes of Steps S4 to S6 are executed.

In Step S7, in a case where it is judged that the measurement for the designated region has ended, the analysis unit 9 maps image data in association with a light irradiation position, to thereby generate a measurement image having position information and time information associated with each other. In addition, the analysis unit 9 generates a pattern image of the semiconductor device D on the basis of the detected reflected light and the laser beam irradiation position (Step S8). The analysis unit 9 can cause the display of the analysis unit 9 to display the measurement image and the pattern image generated in Step S8. In addition, the analysis unit 9 superimposes the pattern image and the measurement image on each other and displays the result on the display (Step S9).

Figure 3:
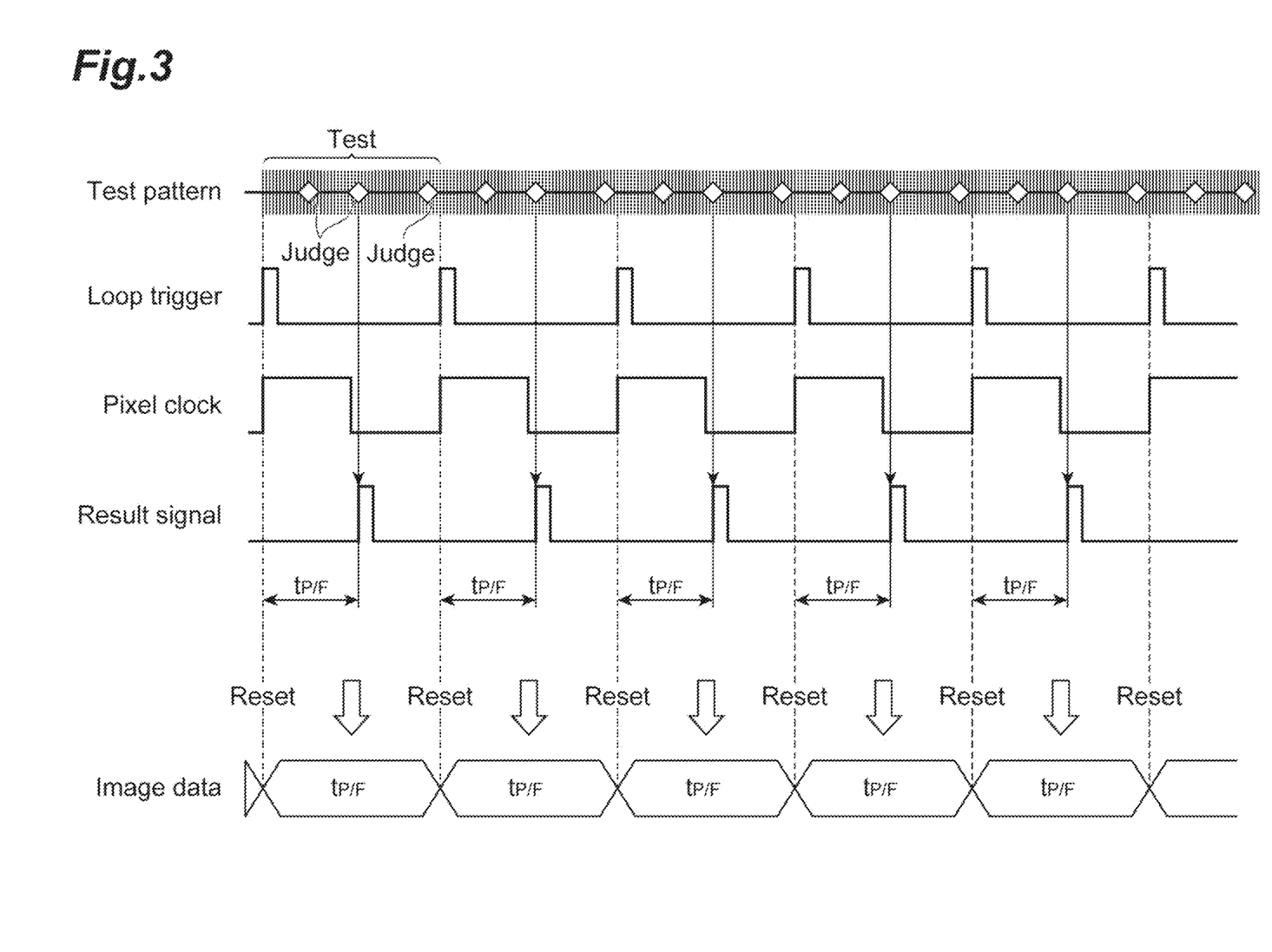
FIG. 3 is a timing diagram illustrating each signal in the semiconductor device inspection method.

FIG. 3 is a timing diagram illustrating an example of each signal in the semiconductor device inspection method. FIG. 3 shows a test pattern signal, a loop trigger signal and a result signal which are output from the LSI tester 2, a pixel clock which is output from the optical scanning control unit 13, and image data which is generated on the basis of the result signal. Timings at which a change in the state of Pass/Fail in time information is judged are shown in the test pattern signal. The shown example is a case where a change in the state of Pass/Fail in time information is judged at timings of three shown points while the test pattern signal loops once. The loop trigger signal and the pixel clock are synchronized with the loop period of the test pattern signal. The result signal is output when a state change occurs in each judgment of Pass/Fail. In the shown example, a time which is taken until the result signal is output from each output of the loop trigger signal is shown by $t_{P/F}$. Each output of the loop trigger signal is a reference for the start of input of the test pattern signal. In addition, the image data is generated in accordance with the period of the loop trigger signal. The image data includes time information ($t_{P/F}$) based on the result signal. In addition, in a case where a change does not occur in the state of Pass/Fail, for example, the time information ($t_{P/F}$) is represented as zero.

Figure 4:
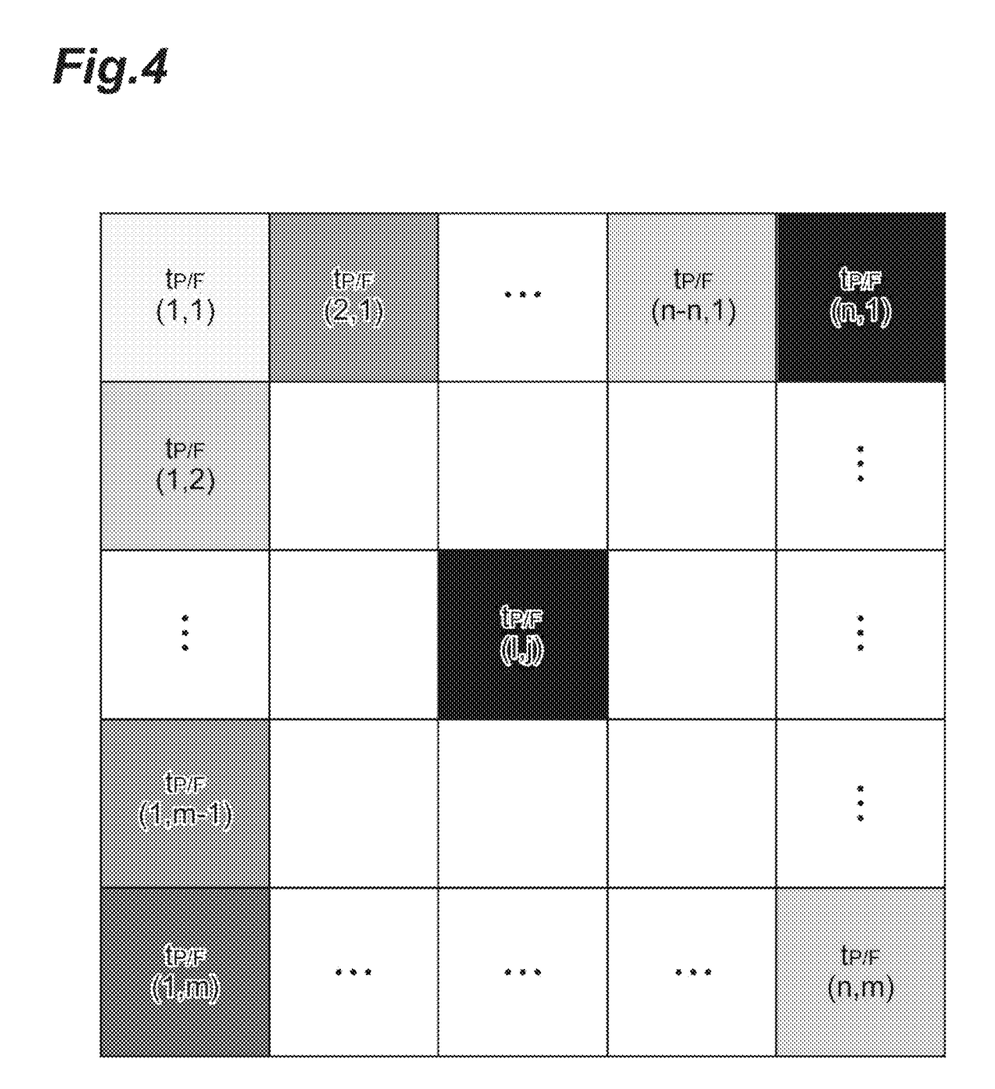
FIG. 4 is an example of a measurement image in an embodiment.

In addition, FIG. 4 is a diagram schematically illustrating an example of a measurement image generated using the semiconductor device inspection method. As show in FIG. 4, the measurement image in the present embodiment is generated by, for example, image data of a gradation associated with time information being mapped with respect to each pixel. For example, a user may designate a desired time as a timing of judgment of Pass/Fail within the time which is taken until the test pattern signal loops once (see FIG. 3). In this case, it is possible to generate an image in which a position having a change in Pass/Fail is color-coded. The color coding is performed for each of designated times. In FIG. 4, the number of times designated by a user is set to be plural, and measurement images in a case where a gradation is changed are displayed for each of the plurality of times. For example, in the drawing, as a time indicated by time information in a pixel becomes longer, the image is displayed by a gradation closer to black. Therefore, it can be understood that time information in a pixel shown at (1, 2) shows a longer time than time information in a pixel shown at (1, 1), and that time information in a pixel shown at (1, m) or (n, 1) shows a much longer time (m and n are any positive integers). In addition, only pixels having a change in the state of Pass/Fail may be highlighted by the result signal before a time designated by a user among the measurement images.

As described above, in the present embodiment, the irradiation of the semiconductor device D with light may cause the occurrence of a change in the state of the semiconductor device D. In a case where a change in the state of the semiconductor device D occurs, a change may also occur in a test signal. Therefore, a change in the state of the semiconductor device can be output as the result signal.

Figure 5:
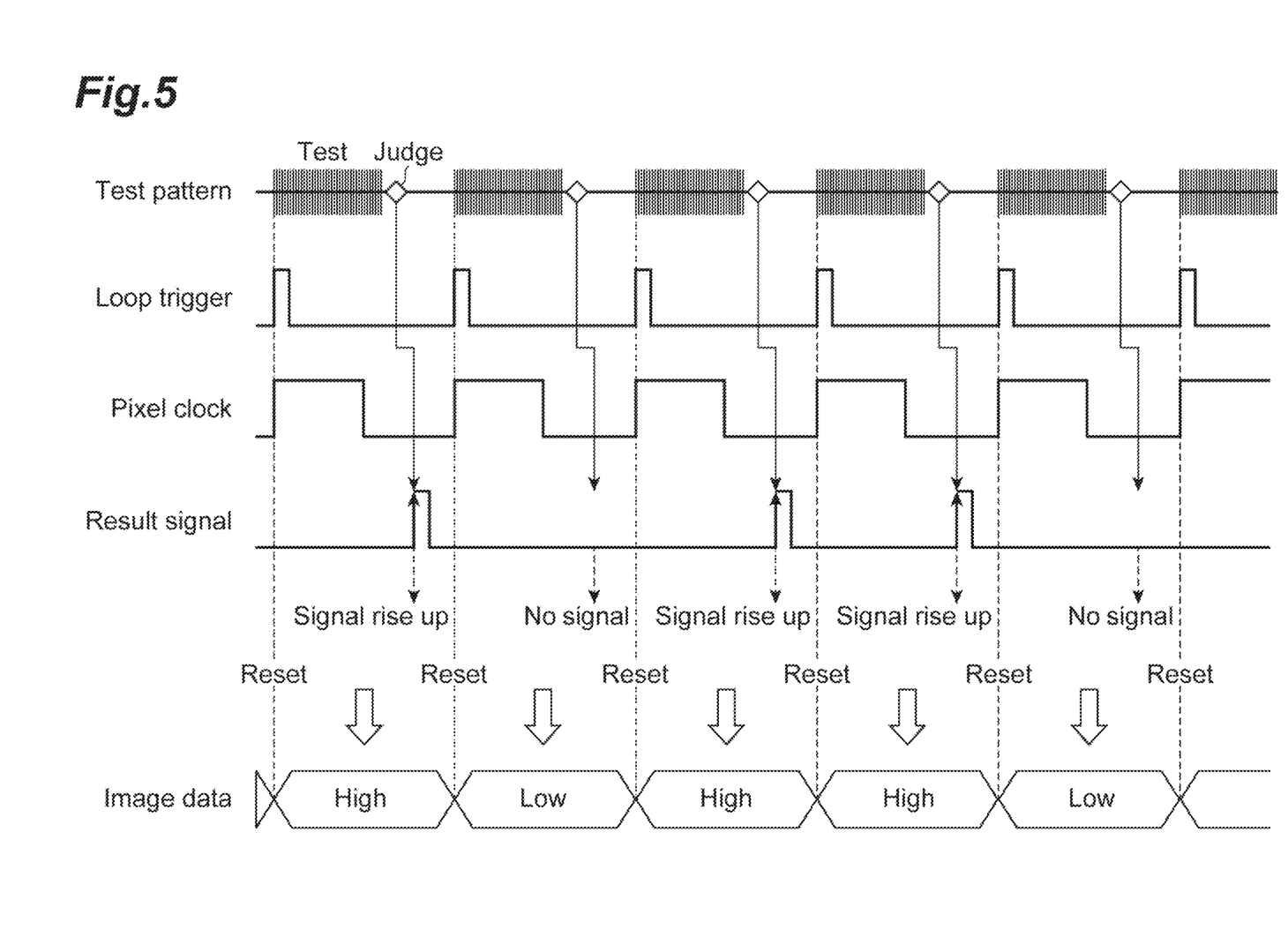
FIG. 5 is a timing diagram illustrating each signal in an inspection method of a comparative example.
Figure 6:
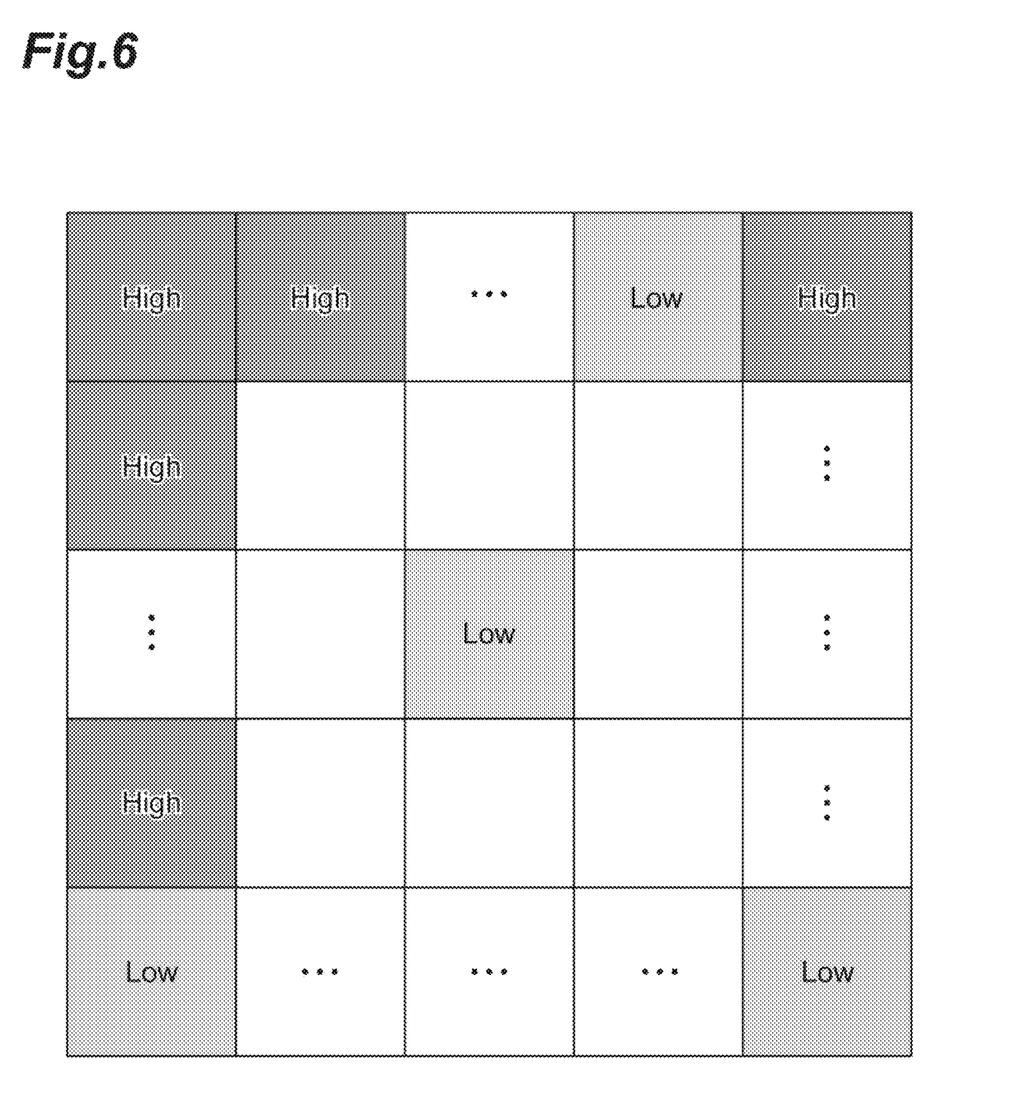
FIG. 6 is an example of a measurement image in the inspection method of the comparative example.

Here, FIGS. 5 and 6 are an example of a comparative example in which only the presence or absence of a change in the state of a semiconductor device is output as a result signal. In this example, the presence or absence of a change in the state of a semiconductor device is judged whenever one loop of input of a test pattern ends, and a result signal is output. Therefore, image data for constituting a measurement image is composed only of High indicating that there is a state change (change from Pass to Fail or from Fail to Pass) and Low indicating that there is not a state change. In this case, as shown in FIG. 6, the measurement image is constituted by binaries of a gradation indicating High and a gradation indicating Low.

In the present embodiment, time information relating to a time from the start of input of a test pattern signal to the output of a result signal is acquired. As a result, it is possible to measure a timing at which a state change occurs. In this manner, it is possible to perform various analyses on a semiconductor device by deriving not only the result signal indicating a state change, but also the time information relating to a state change.

The time measurement unit 11 derives the time information using a loop trigger signal as a reference for the start of input of a test pattern signal. In this manner, it is possible to more reliably specify the start of input of a test pattern signal by using a loop trigger signal as a reference.

The position (position of scanning) of light irradiation performed by the irradiation optical system 5 is moved in accordance with a pixel clock synchronized with the loop trigger signal. Since the loop trigger signal is also synchronized with the test pattern signal, the movement of a light irradiation position on the semiconductor device D and the input of the test pattern signal can be reliably synchronized with each other.

A measurement image having the light irradiation position and the time information associated with each other is generated, and thus it is possible to easily ascertain the time information at the irradiation position. In addition, the pattern image and the measurement image are superimposed on each other, and thus it is possible to easily ascertain a relationship between the time information at the irradiation position and a position on the semiconductor device D.

Second Embodiment

The present embodiment is different from the first embodiment, in that a test pattern signal includes a plurality of test patterns. In addition, a measurement image generated by the analysis unit 9 is also different from that in the first embodiment in association with this difference. Hereinafter, differences from those in the first embodiment will be mainly described. The same or corresponding elements or members are denoted by the same reference numerals and signs, and thus the detailed description thereof will not be given.

Figure 7:
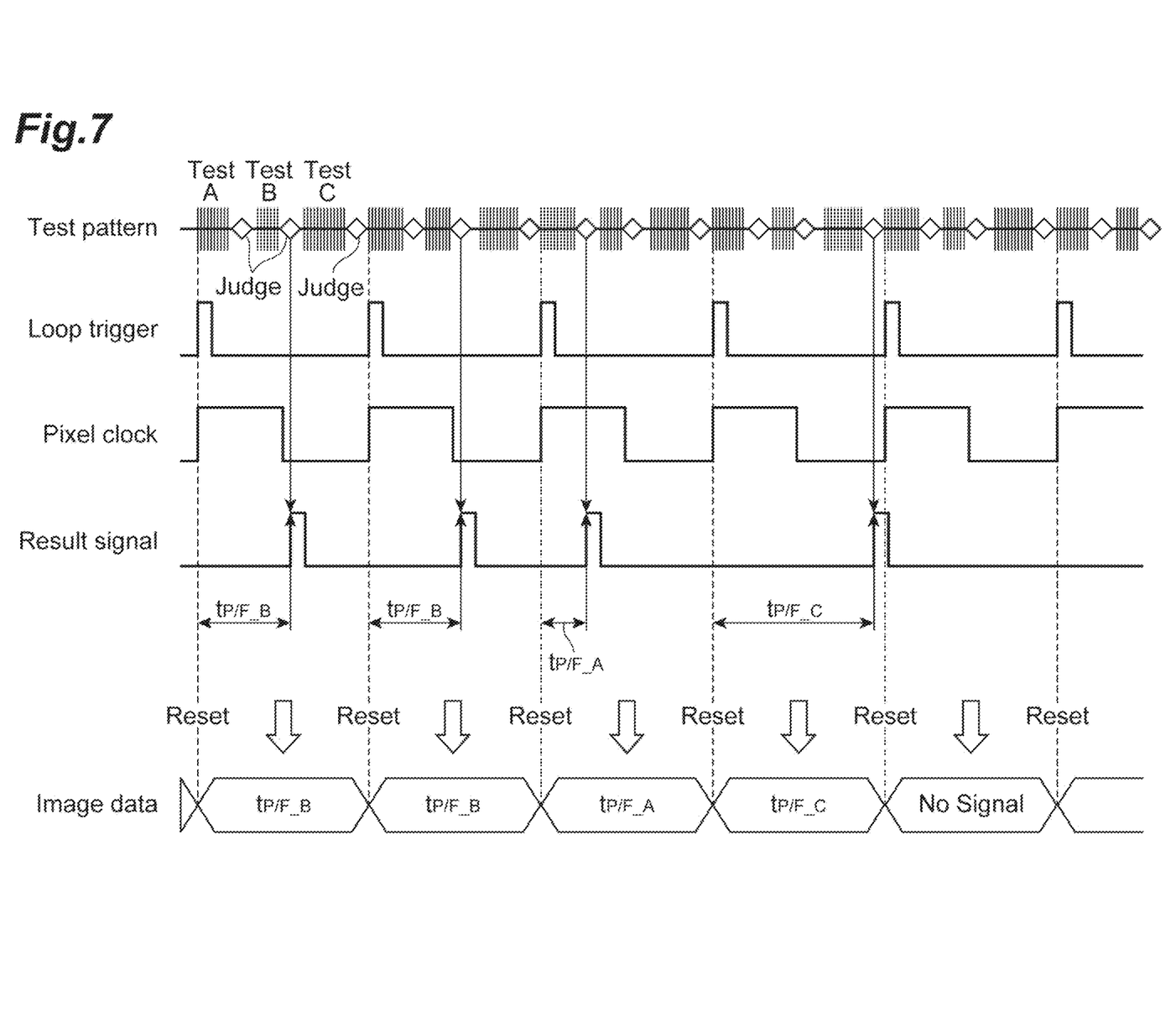
FIG. 7 is a timing diagram illustrating each signal in a semiconductor device inspection method according to another embodiment.
Figure 8:
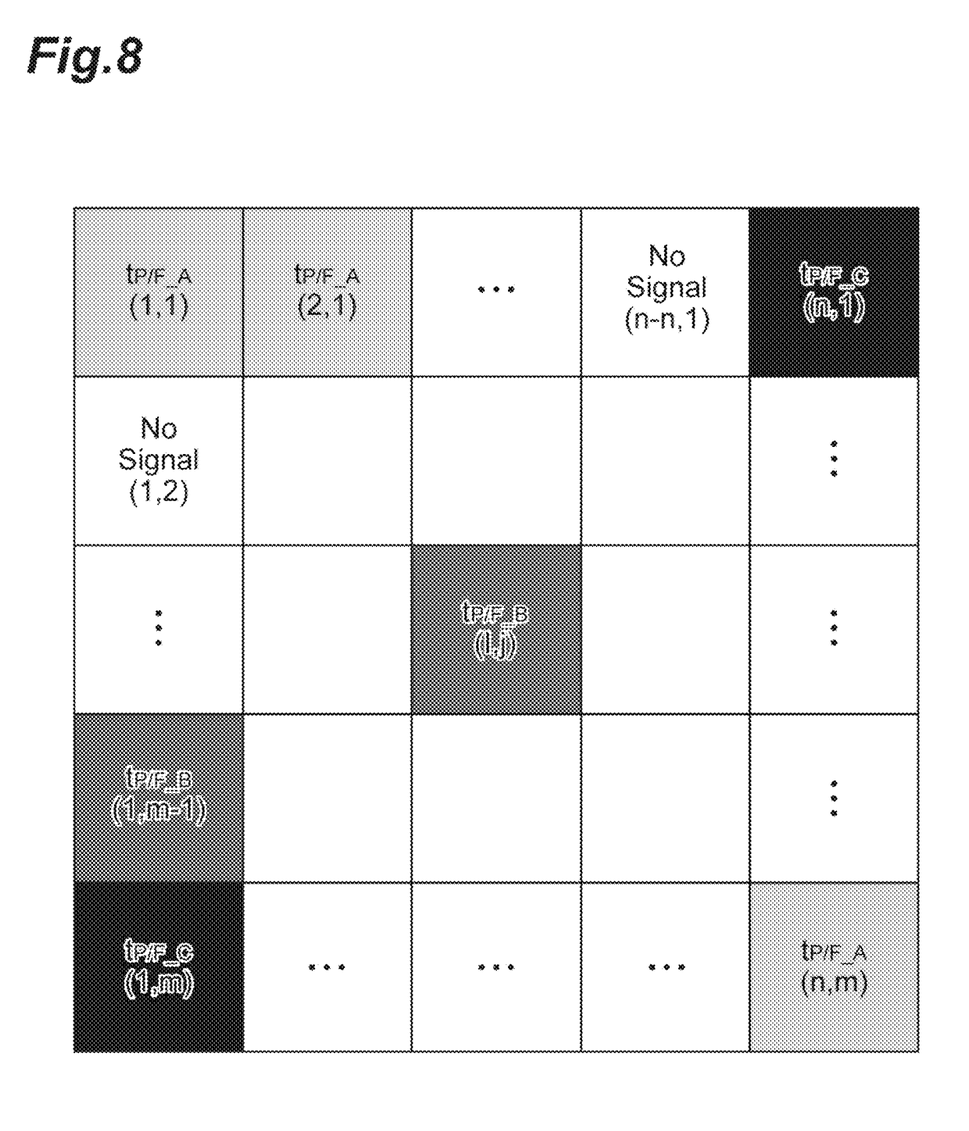
FIG. 8 is an example of a measurement image in another embodiment.

As shown in FIGS. 7 and 8, a test pattern signal which is output from the LSI tester 2 in the present embodiment has three kinds of pattern: a test A, a test B and a test C which are test patterns different from each other. The test A, the test B and the test C are arranged in series with each other. The number of kinds of test pattern included in the test pattern signal may be less than three, and may be greater than three.

In the present embodiment, times at three points immediately after the test A, immediately after the test B, and immediately after the test C are designated, and it is judged whether the state of Pass/Fail has changed at each timing. In a case where a change occurs in the state of Pass/Fail, a result signal which is output from the LSI tester 2 is input to the time measurement unit 11. In the time measurement unit 11, time information relating to times ($t_{P/F\_A}$, $t_{P/F\_B}$, and $t_{P/F\_C}$) from the start of input of the test pattern signal to each output of the result signal is derived on the basis of the input result signal. In the analysis unit 9, image data generated in a gradation associated with the time information is mapped with respect to each pixel (see FIG. 8). In addition, in a case where a change does not occur in the state of Pass/Fail, for example, "no signal" is imparted as image data. In this case, the pixel may be mapped by no color.

In this manner, in the present embodiment, the test pattern signal includes a plurality of test patterns. Therefore, in a single measurement, it is possible to input a plurality of test patterns in which a change in the state of a semiconductor device may occur. In this case, a result signal is output in response to each of the test patterns. It is possible to analyze in which of a plurality of test patterns a change in the state of a semiconductor device occurs in a single measurement. Thereby, it is possible, for example, even for a user who is not skilled to efficiently analyze a semiconductor device.

Hereinbefore, the embodiments have been described in detail with reference to the accompanying drawings, but specific configurations are not limited to these embodiments.

In the above embodiments, an example has been shown in which a test pattern signal is input as an input signal from the LSI tester 2 to the semiconductor device D, but there is no limitation thereto. For example, instead of inputting a test pattern signal, a current may simply be input as an input signal to drive a semiconductor device. Even in a state where a test pattern signal is not input, a semiconductor device is irradiated with a laser beam, and a time from the start of irradiation of a predetermined position to the output of a Pass/Fail signal is detected, whereby it is possible to perform a fault analysis for the semiconductor device.

In addition, an example has been shown in which a measurement image is generated by a gradation according to the value of a time indicated by time information, but there is no limitation thereto. For example, a measurement image may be generated by representing only a pixel corresponding to specific time information using a different color. In addition, a measurement image may be generated by a gradation using a pseudo color according to time information. In addition, a measurement image in which a gradation is represented using the density or the like of a dither pattern may be generated.

In addition, an example has been shown in which the loop trigger signal and the pixel clock are synchronized with each other, but a light irradiation position is not necessarily required to be synchronized with the loop trigger signal. For example, in a case where a light irradiation position is not synchronized with the loop trigger signal, and a light scanning speed is raised, measurement accuracy decreases, but a measurement time can be shortened.

REFERENCE SIGNS LIST

1: semiconductor device inspection apparatus, 2: LSI tester, 3: light source, 5: irradiation optical system, 7: photodetector, 9: analysis unit, 10: control unit, 11: time measurement unit, 13: optical scanning control unit, D: semiconductor device

The invention claimed is:
1. A method for inspecting a semiconductor device, the method comprising:
  inputting an input signal to the semiconductor device;
  irradiating the semiconductor device with light;
  outputting a result signal indicating a change in a state of the semiconductor device based on an output signal which is output from the semiconductor device to which the input signal is input while the semiconductor device is irradiated with the light;

deriving, using a controller that processes signals, time information relating to a time from the input of the input signal to the semiconductor device to the output of the result signal.

2. The method according to claim 1,
wherein inputting the input signal includes generating a loop trigger signal according to the input signal, and
deriving the time information includes using the loop trigger signal as a reference for the input of the input signal.

3. The method according to claim 2,
wherein a position of irradiation with the light is moved in accordance with the loop trigger signal.

4. The method according to claim 1, further comprising generating a measurement image having a position of irradiation with the light and the time information associated with each other.

5. The method according to claim 4, further comprising:
detecting reflected light of the light reflected from the semiconductor device; and
generating a pattern image of the semiconductor device based on the detected reflected light and the position of irradiation with the light.

6. The method according to claim 5, further comprising superimposing the pattern image and the measurement image on each other.

7. The method according to claim 1,
wherein the input signal includes a test pattern signal.

8. The method according to claim 7,
wherein the input signal includes a plurality of test patterns.

9. An apparatus for inspecting a semiconductor device which is an object to be inspected based on a result signal which is output in accordance with input of an input signal to the semiconductor device, the device comprising:

a light source configured to generate light;
a scanner configured to scan the semiconductor device with the light; and
a time measurement device to which the result signal indicating a change in a state of the semiconductor device irradiated with the light is input, and which derives and outputs time information relating to a time from the input of the input signal to the semiconductor device to the output of the result signal.

10. The apparatus according to claim 9,
wherein the time measurement device includes a time-to-digital converter or a time-to-amplitude converter.

11. The apparatus according to claim 9,
wherein the time measurement device has a loop trigger signal according to the input signal input thereto, and uses the loop trigger signal as a reference for the input of the input signal.

12. The apparatus according to claim 9,
wherein the scanner performs scanning with the light in accordance with a loop trigger signal according to the input signal.

13. The apparatus according to claim 9, further comprising an analyzer to which the time information is input, and which generates a measurement image having a position of scanning with the light and the time information associated with each other.

14. The apparatus according to claim 13, further comprising a photodetector configured to detect reflected light of the light reflected from the semiconductor device, and outputs a detection signal,
wherein the analyzer generates a pattern image of the semiconductor device based on the detection signal and the position of scanning with the light.

15. The apparatus according to claim 14,
wherein the analyzer superimposes the pattern image and the measurement image on each other.

* * * * *